(12) United States Patent
Gan et al.

(10) Patent No.: US 11,417,538 B2
(45) Date of Patent: Aug. 16, 2022

(54) SEMICONDUCTOR PACKAGE INCLUDING LEADS OF DIFFERENT LENGTHS

(71) Applicant: Infineon Technologies AG, Neubiberg (DE)

(72) Inventors: Thai Kee Gan, Melaka (MY); Edmund Sales Cabatbat, Roxas (PH)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/882,416

(22) Filed: May 22, 2020

(65) Prior Publication Data
US 2021/0366728 A1    Nov. 25, 2021

(51) Int. Cl.
*H01L 21/48* (2006.01)
*H01L 21/56* (2006.01)
*H01L 21/673* (2006.01)

(52) U.S. Cl.
CPC ........ *H01L 21/4825* (2013.01); *H01L 21/565* (2013.01); *H01L 21/67356* (2013.01)

(58) Field of Classification Search
CPC ........... H01L 23/4952; H01L 23/49562; H01L 23/49575; H01L 24/06; H01L 24/48; H01L 24/49; H01L 2924/19107; H01L 21/565; H01L 21/67356
See application file for complete search history.

(56) References Cited

U.S. PATENT DOCUMENTS

| | | | |
|---|---|---|---|
| 6,479,327 B2 | 11/2002 | Takahashi et al. | |
| 8,847,408 B2* | 9/2014 | Lin | H01L 25/074 257/777 |
| 9,373,566 B2* | 6/2016 | Otremba | H01L 23/49541 |
| 9,490,199 B2 | 11/2016 | Long et al. | |
| 10,325,837 B2* | 6/2019 | Danny Koh | H01L 23/49555 |
| 11,011,445 B2* | 5/2021 | Sung | H01L 24/48 |
| 2012/0175762 A1* | 7/2012 | Hata | H01L 24/36 257/690 |
| 2016/0099189 A1* | 4/2016 | Khai Yen | H01L 24/06 257/676 |
| 2019/0006268 A1* | 1/2019 | Sugiura | H01L 24/32 |

* cited by examiner

*Primary Examiner* — Mohammed Shamsuzzaman
(74) *Attorney, Agent, or Firm* — Dicke, Billig & Czaja, PLLC

(57) ABSTRACT

A semiconductor package includes a die pad, a die, a first lead, a plurality of second leads, and a mold material. The die is electrically coupled to the die pad. The first lead is electrically coupled to the die. The plurality of second leads are electrically coupled to the die. The plurality of second leads are adjacent to the first lead. The mold material encapsulates at least a portion of the die pad, the die, the first lead, and the plurality of second leads. Each of the plurality of second leads extends a farther distance from the mold material than the first lead.

10 Claims, 8 Drawing Sheets

SEMICONDUCTOR PACKAGE INCLUDING LEADS OF DIFFERENT LENGTHS

BACKGROUND

Many electronic devices are being designed to be smaller and slimmer. Semiconductor packages may determine the final design of an electronic device. It may be desirable to reduce the space used on a printed circuit board (PCB) by semiconductor packages to reduce the overall size or dimensions of an electronic device. It may also be desirable to reduce the space used on a PCB by semiconductor packages to enable a greater number of semiconductor packages to be used within an electronic device without increasing the overall size or dimensions of the electronic device.

For these and other reasons, a need exists for the present disclosure.

SUMMARY

One example of a semiconductor package includes a die pad, a die, a first lead, a plurality of second leads, and a mold material. The die is electrically coupled to the die pad. The first lead is electrically coupled to the die. The plurality of second leads are electrically coupled to the die. The plurality of second leads are adjacent to the first lead. The mold material encapsulates at least a portion of the die pad, the die, the first lead, and the plurality of second leads. Each of the plurality of second leads extends a farther distance from the mold material than the first lead.

Another example of a semiconductor package includes a die pad, a die, a first contact pad, a plurality of second contact pads, and a mold material. The die is electrically coupled to the die pad. The first contact pad is electrically coupled to the die. The plurality of second contact pads are electrically coupled to the die. The plurality of second contact pads are adjacent to the first contact pad. The mold material encapsulates at least a portion of the die pad, the die, the first contact pad, and the plurality of second contact pads. Each of the plurality of second contact pads extends a farther distance from the mold material than the first contact pad.

One example of a device includes a printed circuit board, a first power semiconductor SMD package, and a second power semiconductor SMD package. The first power semiconductor SMD package is electrically coupled to the printed circuit board. The first power semiconductor SMD package includes a first lead, a plurality of second leads, and a first mold material. The plurality of second leads are adjacent to the first lead. The first mold material encapsulates at least a portion of the first lead and the plurality of second leads. A length of the first lead extending from the first mold material is less than a length of each of the plurality of second leads extending from the first mold material. The second power semiconductor SMD package is electrically coupled to the printed circuit board and aligned with the first power SMD semiconductor package. The second power semiconductor package includes a third lead, a plurality of fourth leads, and a second mold material. The plurality of fourth leads are adjacent to the third lead. The second mold material encapsulates at least a portion of the third lead and the plurality of fourth leads. A length of the third lead extending from the second mold material is less than a length of each of the plurality of fourth leads extending from the second mold material.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Figure 1A:
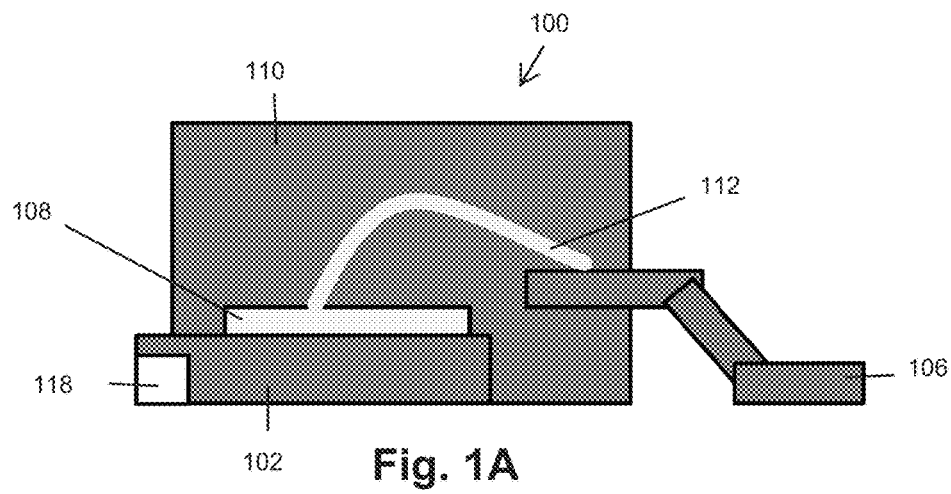
FIGS. 1A-1C illustrate a cross-sectional view, a top view, and a bottom view, respectively, of one example of a semiconductor package.
Figure 1B:
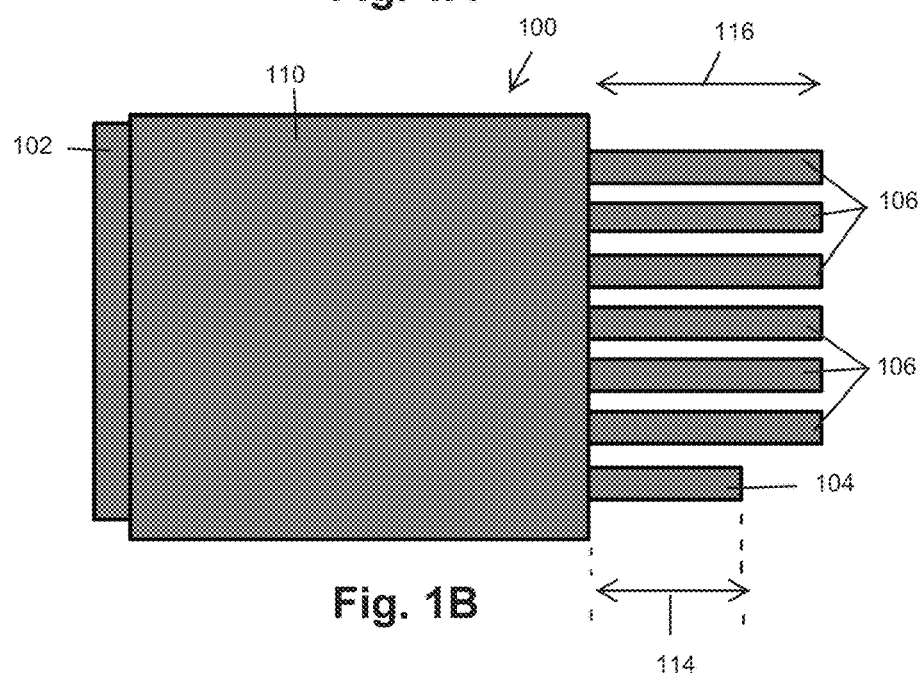
Figure 1C:
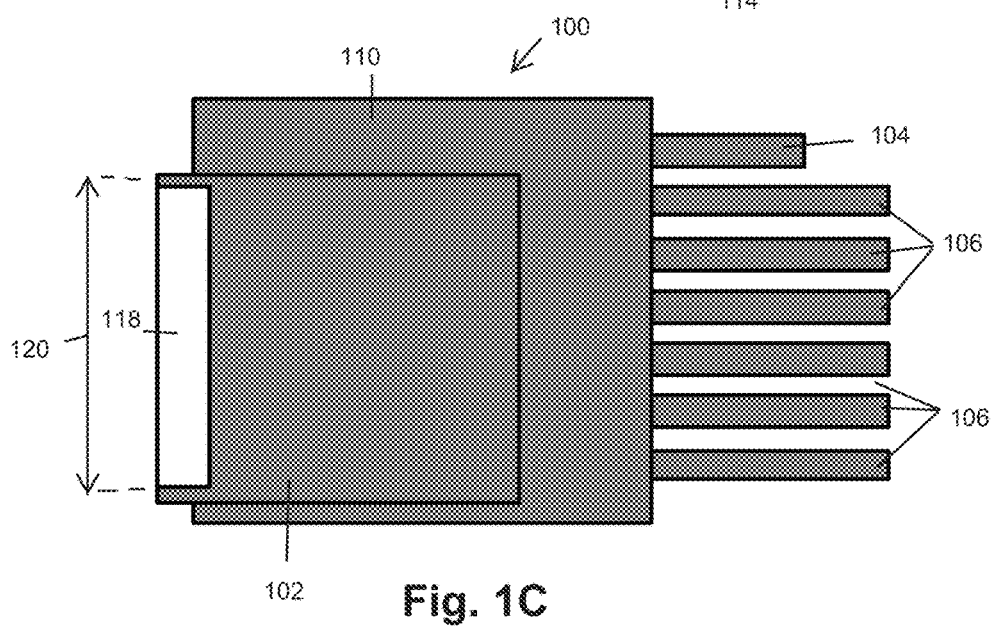

FIGS. 1A-1C illustrate a cross-sectional view, a top view, and a bottom view, respectively, of one example of a semiconductor package 100. Semiconductor package 100 may be a surface mounted device (SMD) package. Semiconductor package 100 includes a lead frame including a die pad 102, a first lead 104, and a plurality of second leads 106. The lead frame may be made of a metal or have a metal surface, such as Ag, Cu, Ni/Pd/Au, NiNiP, or Ni/Pd/AuAg. As illustrated in FIG. 1A, the first lead 104 and the plurality of second leads 106 may be gull-wing leads.

Semiconductor package 100 also includes a die 108 and mold material 110. The die 108 is electrically coupled (e.g., soldered, sintered, etc.) to the die pad 102. The first lead 104 is electrically coupled to the die 108 via a first bond wire (e.g., a bond wire 112). The plurality of second leads 106 are electrically coupled to the die 108 via a plurality of second bond wires (e.g., a plurality of bond wires 112) or a clip (not shown). The plurality of second leads 106 are adjacent to the first lead 104 on the same side of the semiconductor package 100. The mold material 110 encapsulates at least a portion of the die pad 102, the die 108, the first lead 104, the plurality of second leads 106, and the bond wires 112 (or clip). Mold material 110 may include an epoxy or another suitable dielectric material.

Each of the plurality of second leads 106 extends a farther distance from the mold material 110 than the first lead 104. As indicated in FIG. 1B, the first lead 104 extends a first distance (or length) 114 from the sidewall of the mold material 110 and each of the plurality of second leads 106 extends a second distance (or length) 116 from the sidewall of the mold material 110. The second distance 116 is greater than the first distance 114. In one example, the first distance 114 is within a range between about 20% and 80% of the second distance 116, such as between about 40% and 70% of the second distance 116. While in semiconductor package 100, the plurality of second leads 106 includes 6 second leads, in other examples the plurality of second leads may include a different number of second leads.

The die pad 102 may include a recess 118 along a bottom and side of the die pad. The recess 118 is configured to receive second leads of a further semiconductor package to electrically couple the die pad 102 to the second leads of the further semiconductor package as will be described below with reference to FIGS. 2A-2C. As indicated in FIG. 1C, the recess 118 may have a width 120 sufficient to receive each of the plurality of second leads of a further semiconductor package. The recess 118 is arranged on an opposite side of the die 102 from the first lead 104 and the plurality of second leads 106.

In one example, die 108 includes a transistor, such as a power transistor. In one example, the die pad 102 is electrically coupled to a source of the transistor, the first lead 104 is electrically coupled to a gate of the transistor, and the plurality of second leads 106 are electrically coupled to a drain of the transistor. In another example, the die pad 102 is electrically coupled to a drain of the transistor, the first lead 104 is electrically coupled to a gate of the transistor, and the plurality of second leads 106 are electrically coupled to a source of the transistor.

Figure 2A:
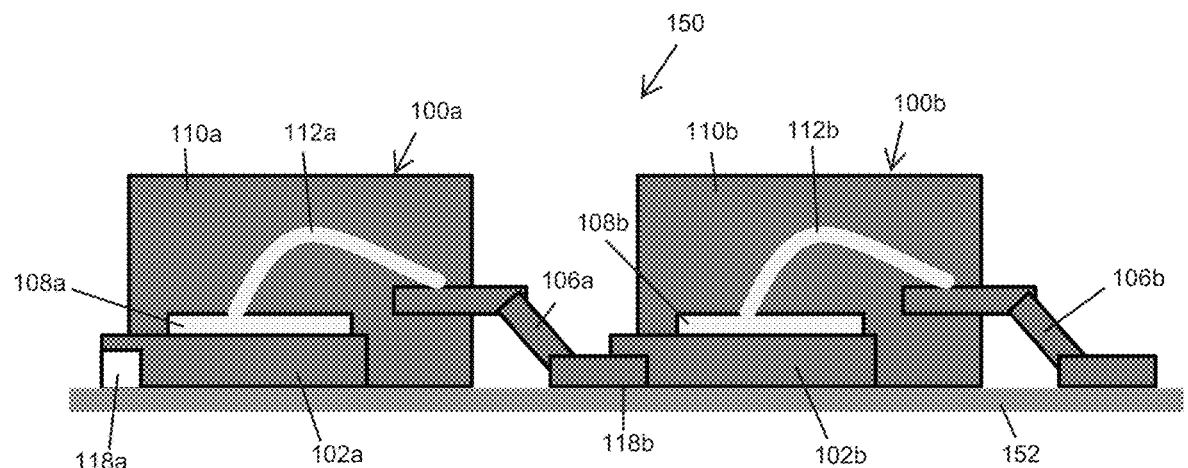
FIGS. 2A-2C illustrate a cross-sectional view, a top view, and a bottom view, respectively, of one example of an electronic device including the semiconductor package of FIGS. 1A-1C.
Figure 2B:
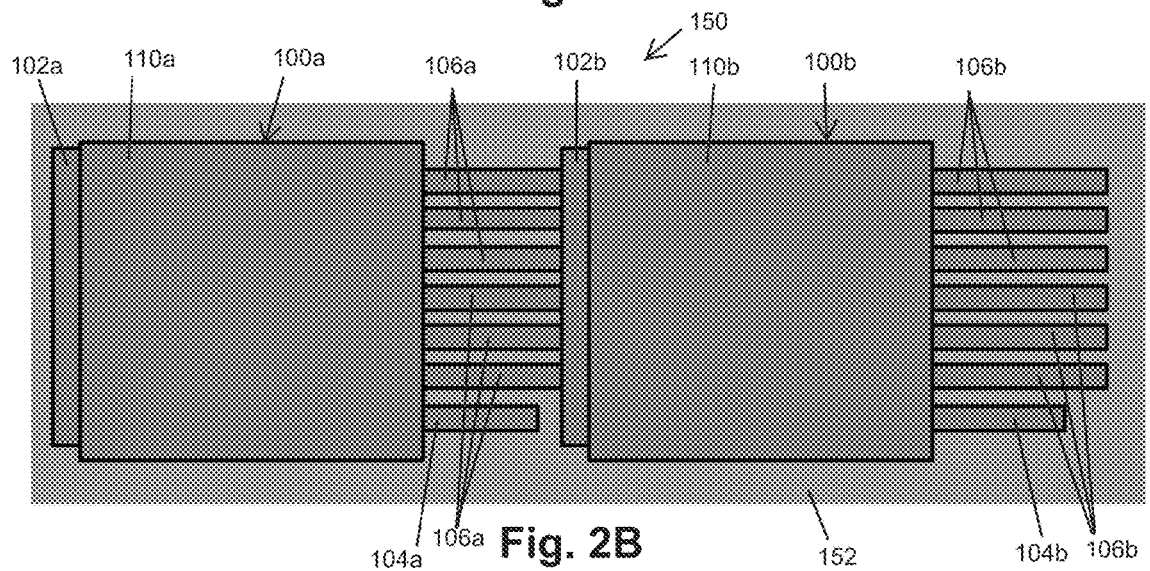
Figure 2C:
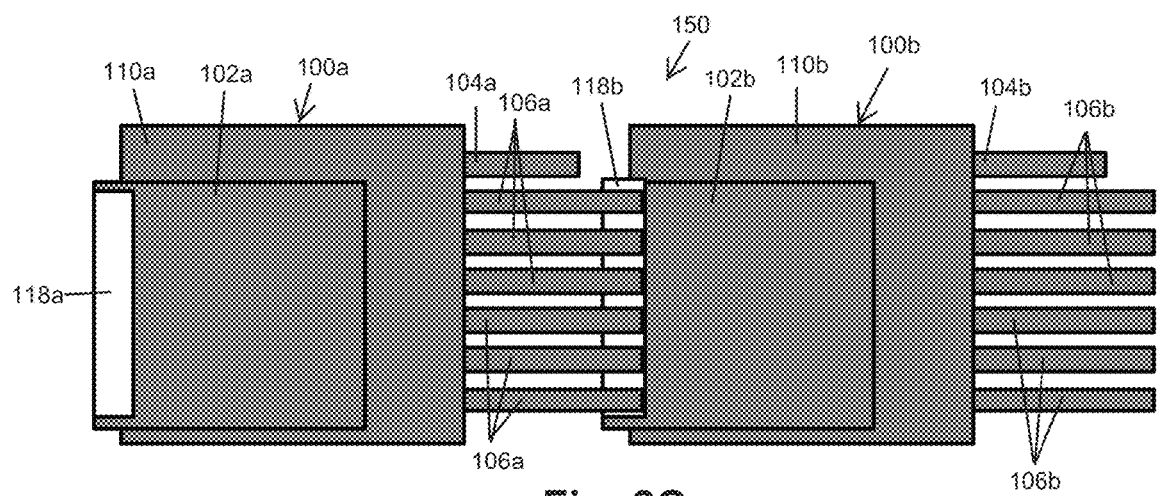

FIGS. 2A-2C illustrate a cross-sectional view, a top view, and a bottom view (with the PCB removed), respectively, of one example of an electronic device 150 including the semiconductor 100 package of FIGS. 1A-1C. Electronic device 150 includes a printed circuit board 152, a first semiconductor package (e.g., a first power semiconductor SMD package) 100a, and a second semiconductor package (e.g., a second power semiconductor SMD package) 100b. The first semiconductor package 100a and the second semiconductor package 100b are electrically coupled (e.g., soldered, sintered, etc.) to the printed circuit board 152.

The first semiconductor package 100a is similar to semiconductor package 100 previously described and illustrated with reference to FIGS. 1A-1C. The first semiconductor package 100a includes a first die pad 102a, a first lead 104a, a plurality of second leads 106a adjacent to the first lead 104a, a first die 108a, first bond wires 112a, and a first mold material 110a. The first die 108a is electrically coupled to the first die pad 102a, the first lead 104a, and the plurality of second leads 106a. The first mold material 110a encapsulates at least a portion of the first die pad 102a, the first lead 104a, the plurality of second leads 106a, the first die 108a, and the first bond wires 112a. A length of the first lead 104a extending from the first mold material 110a is less than a length of each of the plurality of second leads 106a extending from the first mold material 110a. The first die pad 102a includes a first recess 118a.

The second semiconductor package 100b is similar to semiconductor package 100 previously described and illustrated with reference to FIGS. 1A-1C. The second semiconductor package 100b includes a second die pad 102b, a third lead 104b, a plurality of fourth leads 106b adjacent to the third lead 104b, a second die 108b, second bond wires 112b, and a second mold material 110b. The second die 108b is electrically coupled to the second die pad 102b, the third lead 104b, and the plurality of fourth leads 106b. The second mold material 110b encapsulates at least a portion of the second die pad 102b, the third lead 104b, the plurality of fourth leads 106b, the second die 108b, and the second bond wires 112b. A length of the third lead 104b extending from the second mold material 110b is less than a length of each of the plurality of fourth leads 106b extending from the second mold material 110b. The second die pad 102b includes a second recess 118b.

The plurality of second leads 106a of the first semiconductor package 100a are inserted into the second recess 118b and electrically coupled (e.g., soldered, sintered, etc.) to the second die pad 102b of the second semiconductor package 100b. Since the first lead 104a of the first semiconductor package 100a extends a shorter length from the first mold material 110a than the plurality of second leads 106a, the plurality of second leads 106a may be directly electrically coupled to the second die pad 102b of the second semiconductor package 100b without shorting the first lead 104a to the plurality of second leads 106a or to the second die pad 102b. In this way, the occupied space on printed circuit board 152 due to electronic device 150 may be reduced compared to an electronic device where the plurality of second leads 106a are not directly electrically coupled to the second die pad 102b of the second semiconductor package 100b.

Figure 3:
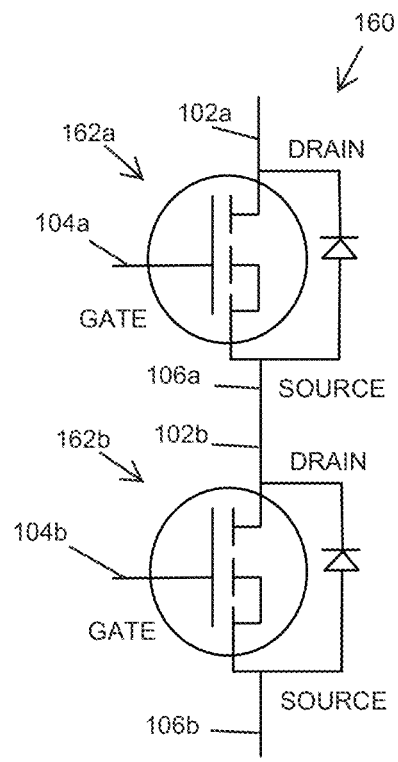
FIG. 3 is a schematic diagram illustrating one example of a circuit for the electronic device of FIGS. 2A-2C.

FIG. 3 is a schematic diagram illustrating one example of a circuit 160 for the electronic device 150 of FIGS. 2A-2C. Circuit 160 includes a first power transistor 162a and a second power transistor 162b. The first power transistor 162a may be provided by first semiconductor package 100a of FIGS. 2A-2C, and the second power transistor 162b may be provided by the second semiconductor package 100b of FIGS. 2A-2C. The gate of first transistor 162a may be coupled to first lead 104a, the drain of first transistor 162a may be coupled to first die pad 102a, and the source of first transistor 162a may be coupled to the plurality of second leads 106a. The gate of second transistor 162b may be coupled to third lead 104b, the drain of second transistor 162b may be coupled to second die pad 102b, and the source of second transistor 162b may be coupled to the plurality of fourth leads 106b. The plurality of second leads 106a are electrically coupled to the second die pad 102b.

Figure 4:
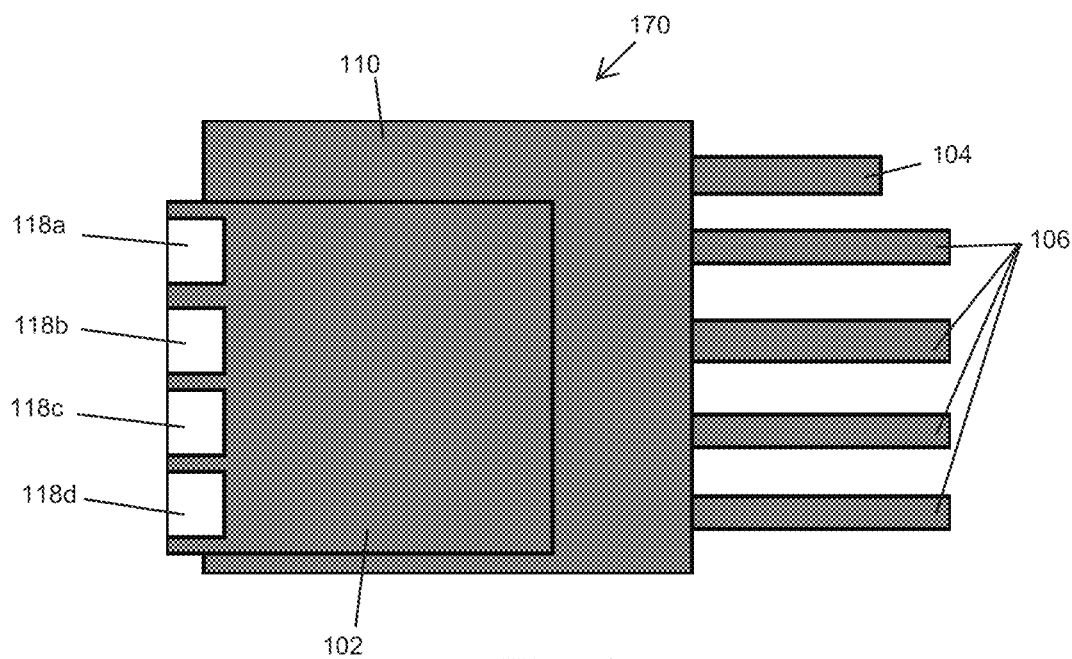
FIG. 4 illustrates a bottom view of another example of a semiconductor package.

FIG. 4 illustrates a bottom view of another example of a semiconductor package 170. Semiconductor package 170 is similar to semiconductor package 100 previously described and illustrated with reference to FIGS. 1A-1C, except that semiconductor package 170 includes a plurality of recesses 118a-118d in place of a single recess 118. In addition, semiconductor package 170 includes 4 second leads 106 rather than 6 second leads 106. Each recess 118a, 118b, 118c, and 118d is configured to receive a single second lead 106 of a further semiconductor package to electrically couple the die pad 102 to the second leads of the further semiconductor package.

Figure 5A:
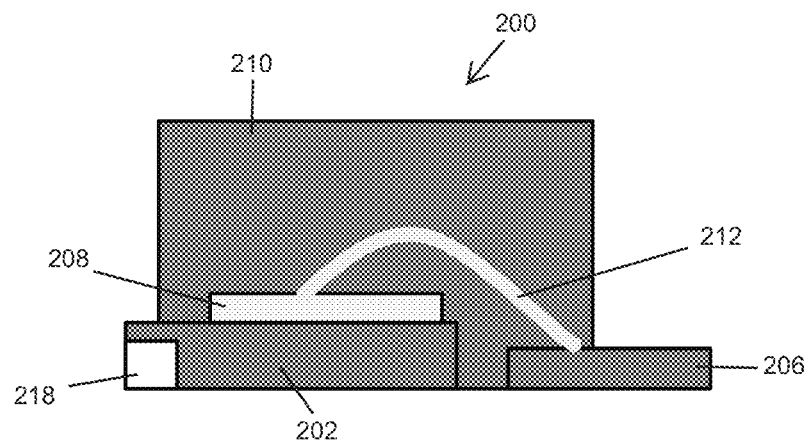
FIGS. 5A-5C illustrate a cross-sectional view, a top view, and a bottom view, respectively, of another example of a semiconductor package.
Figure 5B:
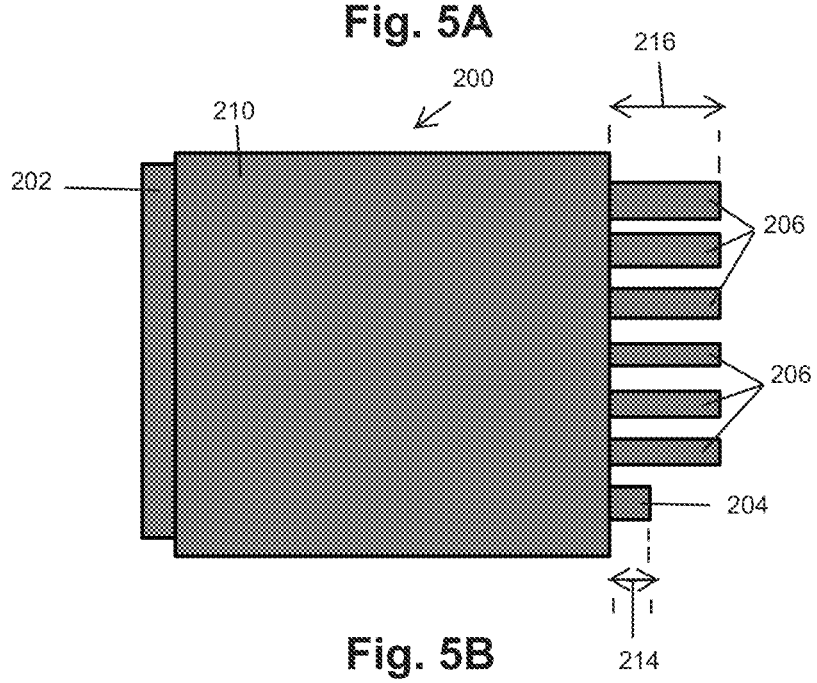
Figure 5C:
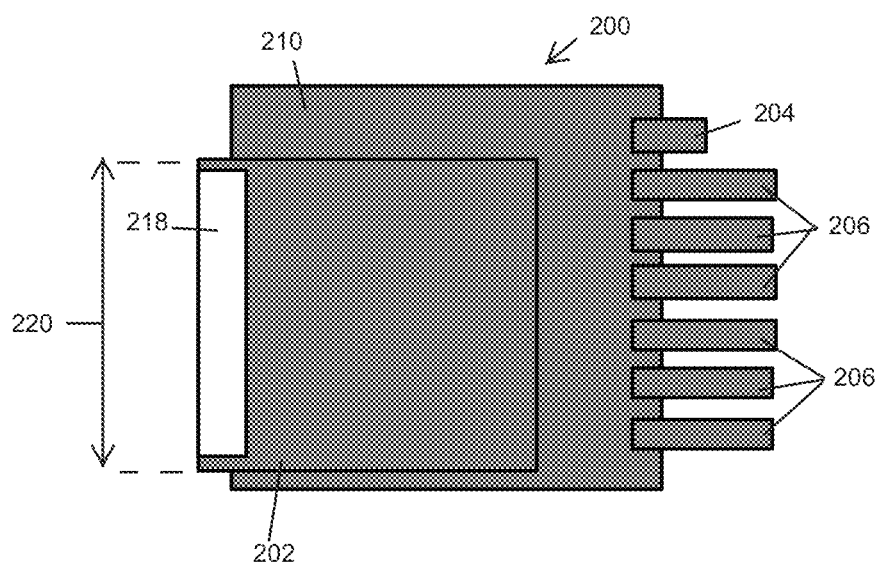

FIGS. 5A-5C illustrate a cross-sectional view, a top view, and a bottom view, respectively, of another example of a semiconductor package 200. Semiconductor package 200 may be a SMD package. Semiconductor package 200 includes a lead frame including a die pad 202, a first contact pad or lead 204, and a plurality of second contact pads or leads 206. The lead frame may be made of a metal or have a metal surface, such as Ag, Cu, Ni/Pd/Au, NiNiP, or Ni/Pd/AuAg. As illustrated in FIG. 5A, the first contact pad or lead 204 and the plurality of second contact pads or leads 206 may be flat and coplanar with the die pad 202.

Semiconductor package 200 also includes a die 208 and mold material 210. The die 208 is electrically coupled (e.g., soldered, sintered, etc.) to the die pad 202. The first contact pad or lead 204 is electrically coupled to the die 208 via a first bond wire (e.g., a bond wire 212). The plurality of second contact pads or leads 206 are electrically coupled to the die 208 via a plurality of second bond wires (e.g., a plurality of bond wires 212) or a clip (not shown). The plurality of second contact pads or leads 206 are adjacent to the first contact pad or lead 204 on the same side of the semiconductor package 200. The mold material 210 encapsulates at least a portion of the die pad 202, the die 208, the first contact pad or lead 204, the plurality of second contact pads or leads 206, and the bond wires 212 (or clip). Mold material 210 may include an epoxy or another suitable dielectric material.

Each of the plurality of second contact pads or leads 206 extends a farther distance from the mold material 210 than the first contact pad or lead 204. As indicated in FIG. 5B, the first contact pad or lead 204 extends a first distance (or length) 214 from the sidewall of the mold material 210 and each of the plurality of second contact pads or leads 206 extends a second distance (or length) 216 from the sidewall of the mold material 210. The second distance 216 is greater than the first distance 214. In one example, the first distance 214 is within a range between about 20% and 80% of the second distance 216, such as between about 30% and 60% of the second distance 216. While in semiconductor package 200, the plurality of second contact pads or leads 206 includes 6 second contact pads or leads, in other examples the plurality of second contact pads or leads may include a different number of second contact pads or leads.

The die pad 202 may include a recess 218 along a bottom and side of the die pad. The recess 218 is configured to receive second contact pads or leads of a further semiconductor package to electrically couple the die pad 202 to the second contact pads or leads of the further semiconductor package as will be described below with reference to FIGS. 6A-6C. As indicated in FIG. 5C, the recess 218 may have a width 220 sufficient to receive each of the plurality of second contact pads or leads of a further semiconductor package. The recess 218 is arranged on an opposite side of the die 202 from the first contact pad or lead 204 and the plurality of second contact pads or leads 206.

In one example, die 208 includes a transistor, such as a power transistor. In one example, the die pad 202 is electrically coupled to a source of the transistor, the first contact pad or lead 204 is electrically coupled to a gate of the transistor, and the plurality of second contact pads or leads 206 are electrically coupled to a drain of the transistor. In another example, the die pad 202 is electrically coupled to a drain of the transistor, the first contact pad or lead 204 is electrically coupled to a gate of the transistor, and the plurality of second contact pads or leads 206 are electrically coupled to a source of the transistor.

Figure 6A:
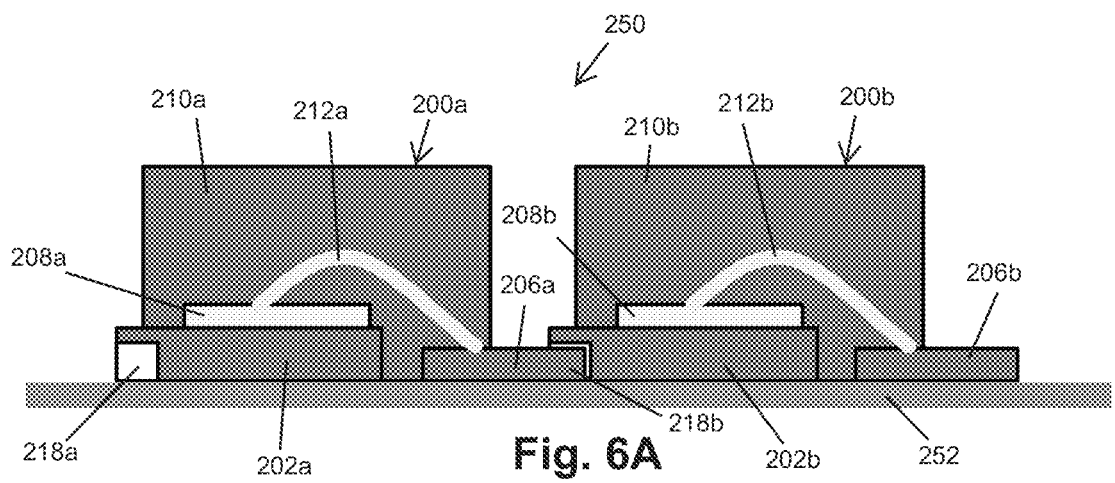
FIGS. 6A-6C illustrate a cross-sectional view, a top view, and a bottom view, respectively, of one example of an electronic device including the semiconductor package of FIGS. 5A-5C.
Figure 6B:
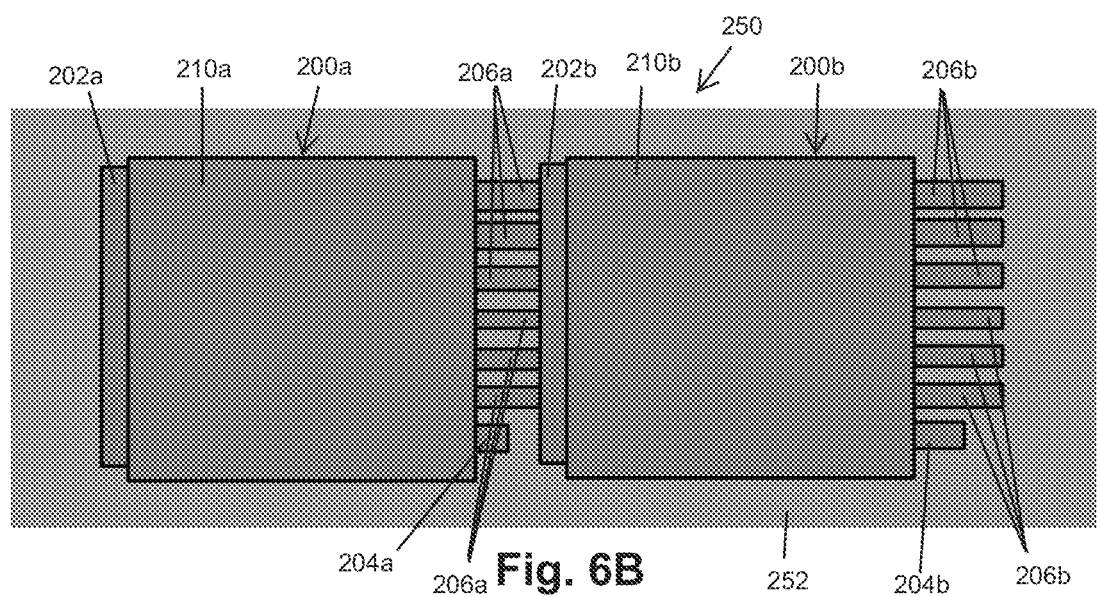
Figure 6C:
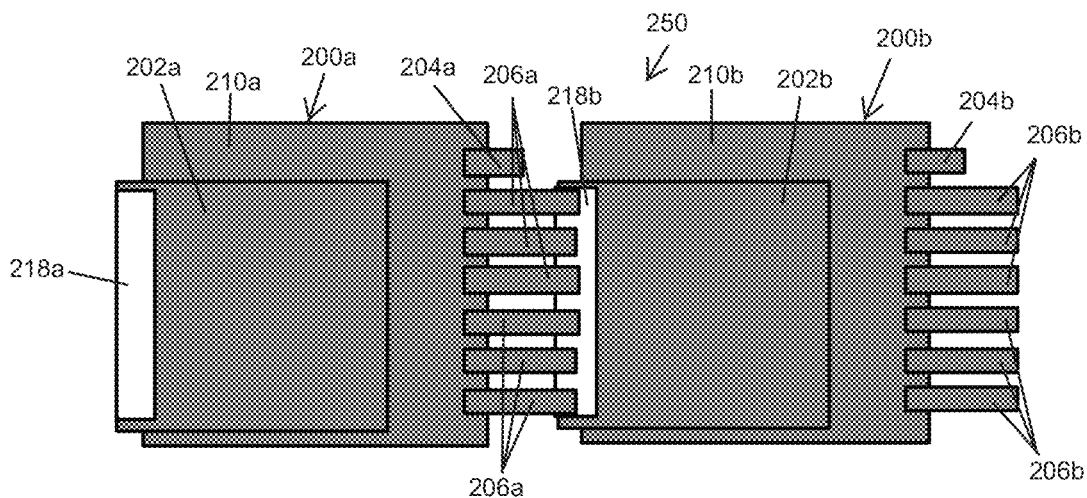

FIGS. 6A-6C illustrate a cross-sectional view, a top view, and a bottom view (with the PCB removed), respectively, of one example of an electronic device 250 including the semiconductor package 200 of FIGS. 5A-5C. Electronic device 250 includes a printed circuit board 252, a first semiconductor package (e.g., a first power semiconductor SMD package) 200a, and a second semiconductor package (e.g., a second power semiconductor SMD package) 200b. The first semiconductor package 200a and the second semiconductor package 200b are electrically coupled (e.g., soldered, sintered, etc.) to the printed circuit board 252.

The first semiconductor package 200a is similar to semiconductor package 200 previously described and illustrated with reference to FIGS. 5A-5C. The first semiconductor package 200a includes a first die pad 202a, a first contact pad or lead 204a, a plurality of second contact pads or leads 206a adjacent to the first contact pad or lead 204a, a first die 208a, first bond wires 212a, and a first mold material 210a. The first die 208a is electrically coupled to the first die pad 202a, the first contact pad or lead 204a, and the plurality of second contact pads or leads 206a. The first mold material 210a encapsulates at least a portion of the first die pad 202a, the first contact pad or lead 204a, the plurality of second contact pads or leads 206a, the first die 208a, and the first bond wires 212a. A length of the first contact pad or lead 204a extending from the first mold material 210a is less than a length of each of the plurality of second contact pads or leads 206a extending from the first mold material 210a. The first die pad 202a includes a first recess 218a.

The second semiconductor package 200b is similar to semiconductor package 200 previously described and illustrated with reference to FIGS. 5A-5C. The second semiconductor package 200b includes a second die pad 202b, a third contact pad or lead 204b, a plurality of fourth contact pads or leads 206b adjacent to the third contact pad or lead 204b, a second die 208b, second bond wires 212b, and a second mold material 210b. The second die 208b is electrically coupled to the second die pad 202b, the third contact pad or lead 204b, and the plurality of fourth contact pads or leads 206b. The second mold material 210b encapsulates at least a portion of the second die pad 202b, the third contact pad or lead 204b, the plurality of fourth contact pads or leads 206b, the second die 208b, and the second bond wires 212b. A length of the third contact pad or lead 204b extending from the second mold material 210b is less than a length of each of the plurality of fourth contact pads or leads 206b extending from the second mold material 210b. The second die pad 202b includes a second recess 218b.

The plurality of second contact pads or leads 206a of the first semiconductor package 200a are inserted into the second recess 218b and electrically coupled (e.g., soldered, sintered, etc.) to the second die pad 202b of the second semiconductor package 200b. Since the first contact pad or lead 204a of the first semiconductor package 200a extends a shorter length from the first mold material 210a than the plurality of second contact pads or leads 206a, the plurality of second contact pads or leads 206a may be directly electrically coupled to the second die pad 202b of the second semiconductor package 200b without shorting the first contact pad or lead 204a to the plurality of second contact pads or leads 206a or to the second die pad 202b. In this way, the occupied space on printed circuit board 252 due to electronic device 250 may be reduced compared to an electronic device where the plurality of second contact pads or leads 206a are not directly electrically coupled to the second die pad 202b of the second semiconductor package 200b.

Figure 7:
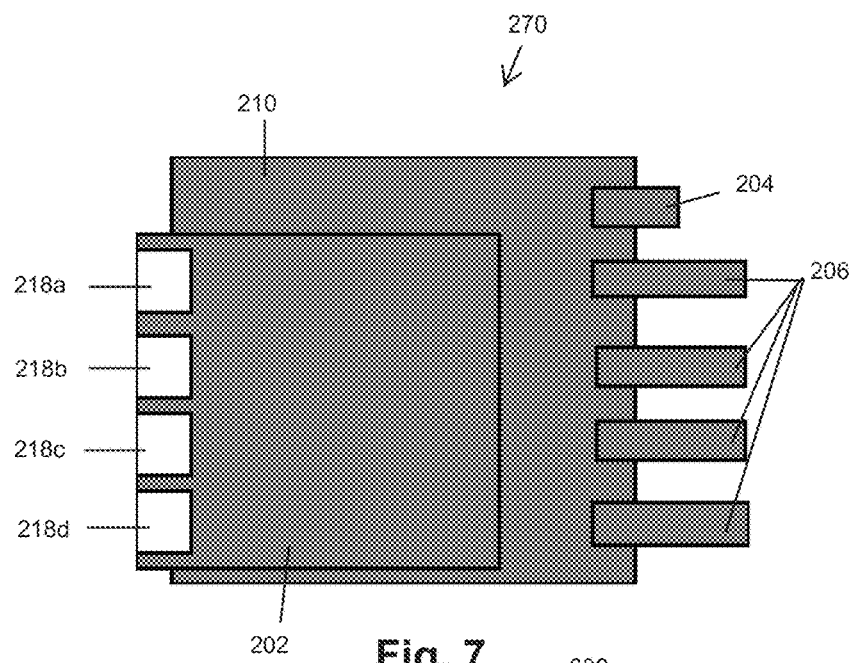
FIG. 7 illustrates a bottom view of another example of a semiconductor package.

FIG. 7 illustrates a bottom view of another example of a semiconductor package 270. Semiconductor package 270 is similar to semiconductor package 200 previously described and illustrated with reference to FIGS. 5A-5C, except that semiconductor package 270 includes a plurality of recesses 218a-218d in place of a single recess 218. In addition, semiconductor package 270 includes 4 second contact pads or leads 206 rather than 6 second contact pads or leads 206. Each recess 218a, 218b, 218c, and 218d is configured to receive a single second contact pad or lead 206 of a further semiconductor package to electrically couple the die pad 202 to the second contact pads or leads of the further semiconductor package.

Figure 8A:
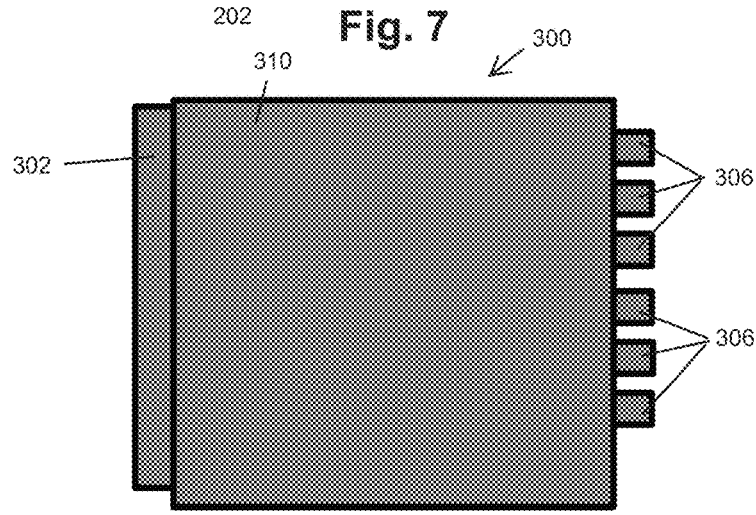
FIGS. 8A and 8B illustrate a top view and a bottom view, respectively, of another example of a semiconductor package.
Figure 8B:
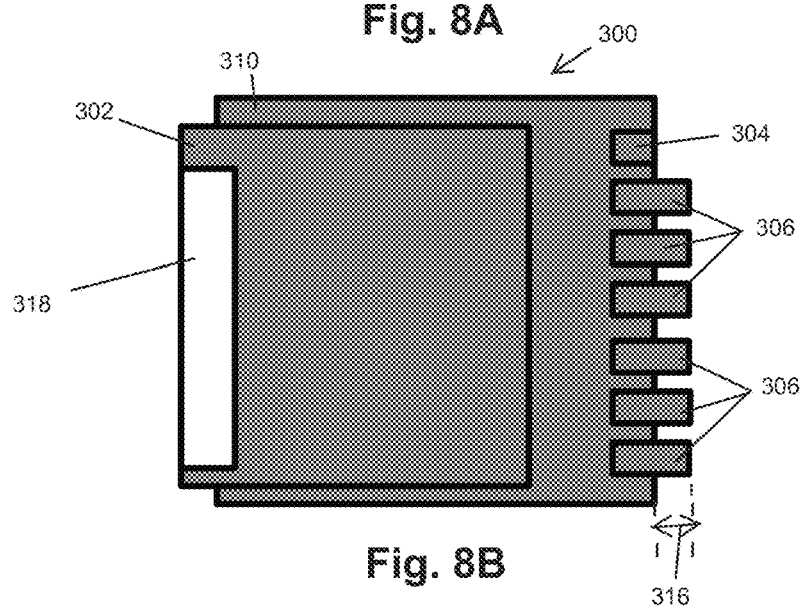

FIGS. 8A and 8B illustrate a top view and a bottom view, respectively, of another example of a semiconductor package 300. Semiconductor package 300 includes a die pad 302, a first contact pad or lead 304, a plurality of second contact pads or leads 306, and a mold material 310. Die pad 302 includes a recess 318. Semiconductor package 300 is similar to semiconductor package 200 previously described and illustrated with reference to FIGS. 5A-5C, except that in semiconductor package 300 the first contact pad or lead 304 is covered by the mold material 310.

Each of the plurality of second contact pads or leads 306 extends a farther distance from the mold material 310 than the first contact pad or lead 304, which does not extend at all from mold material 310. As indicated in FIG. 8B, the first contact pad or lead 304 does not extend from the sidewall of the mold material 310 and each of the plurality of second contact pads or leads 306 extends a distance (or length) 316 from the sidewall of the mold material 310. While in semiconductor package 300, the plurality of second contact pads or leads 306 includes 6 second pads or leads, in other examples the plurality of second contact pads or leads may include a different number of second contact pads or leads.

Figure 9:
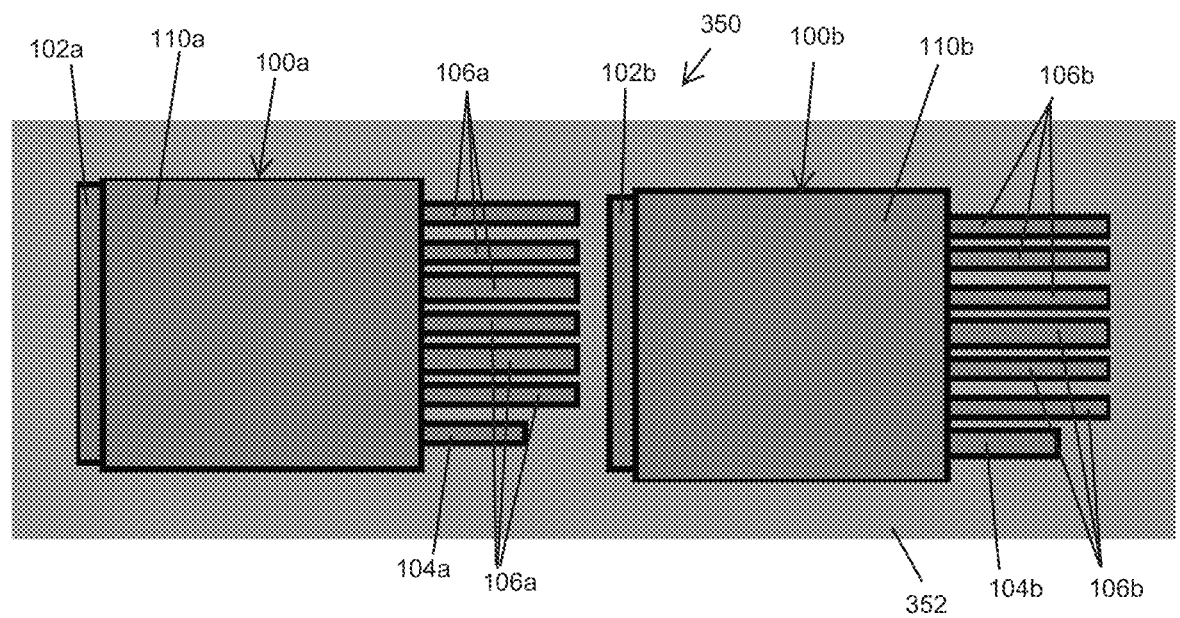
FIG. 9 illustrates a top view of one example of an electronic device.

FIG. 9 illustrates a top view of one example of an electronic device 350. Electronic device 350 includes a printed circuit board 352. In this example, electronic device 350 also includes semiconductor packages 100 previously described and illustrated with reference to FIG. 1A-1C including a first semiconductor package (e.g., a first power semiconductor SMD package) 100a, and a second semiconductor package (e.g., a second power semiconductor SMD package) 100b. The first semiconductor package 100a and the second semiconductor package 100b are electrically coupled (e.g., soldered, sintered, etc.) to the printed circuit board 352. In another example, electronic device 350 may include semiconductor packages 200 previously described and illustrated with reference to FIGS. 5A-5C in place of semiconductor packages 100.

The first semiconductor package 100a includes a first die pad 102a, a first lead 104a, a plurality of second leads 106a adjacent to the first lead 104a, and a first mold material 110a. The first mold material 110a encapsulates at least a portion of the first die pad 102a, the first lead 104a, and the plurality of second leads 106a. A length of the first lead 104a extending from the first mold material 110a is less than a length of each of the plurality of second leads 106a extending from the first mold material 110a. In this example, the recess of the first die pad 102a may be excluded.

The second semiconductor package 100b includes a second die pad 102b, a third lead 104b, a plurality of fourth leads 106b adjacent to the third lead 104b, and a second mold material 110b. The second mold material 110b encapsulates at least a portion of the second die pad 102b, the third lead 104b, and the plurality of fourth leads 106b. A length of the third lead 104b extending from the second mold material 110b is less than a length of each of the plurality of fourth leads 106b extending from the second mold material 110b. In this example, the recess of the second die pad 102b may be excluded.

The first semiconductor package 100a is aligned with the second semiconductor package 100b, such that the plurality of second leads 106a are close to the second die pad 102b. Since the first lead 104a of the first semiconductor package 100a extends a shorter length from the first mold material 110a than the plurality of second leads 106a, the plurality of second leads 106a may be arranged closer to the second die pad 102b of the second semiconductor package 100b without shorting the first lead 104a to the plurality of second leads 106a or to the second die pad 102b. In this way, the occupied space on printed circuit board 352 due to electronic device 350 may be reduced compared to an electronic device where first lead 104a has the same length from the first mold material 110a as the plurality of second leads 106a. In addition, the shorter first lead 104a and third lead 104b each have a lower resistance and a lower inductance compared to each of the plurality of second leads 106a and each of the plurality of fourth leads 106b. In the example where the first lead 104a and the third lead 104b are gate leads of a transistor, the shorter gate leads reduce the gate loop inductance, which enables an increased drive current and an increased transistor switching speed.

Figure 10:
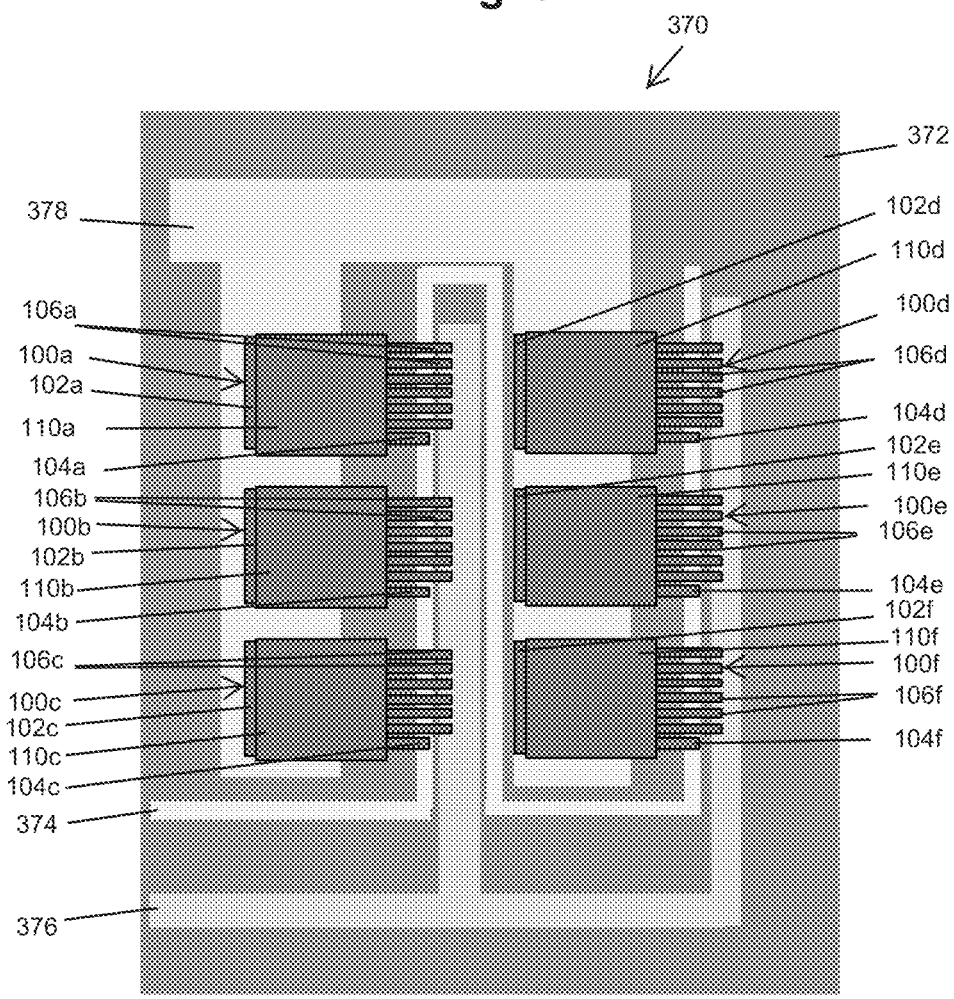
FIG. 10 illustrates a top view of another example of an electronic device.

FIG. 10 illustrates a top view of another example of an electronic device 370. Electronic device 370 includes a printed circuit board 372. In this example, electronic device 370 also includes a plurality of semiconductor packages 100 previously described and illustrated with reference to FIG. 1A-1C including a first semiconductor package (e.g., a first power semiconductor SMD package) 100a, and a second semiconductor package (e.g., a second power semiconductor SMD package) 100b, a third semiconductor package (e.g., a third power semiconductor SMD package) 100c, a fourth semiconductor package (e.g., a fourth power semiconductor SMD package) 100d, a fifth semiconductor package (e.g., a fifth power semiconductor SMD package) 100e, and a sixth semiconductor package (e.g., a sixth power semiconductor SMD package) 100f. The semiconductor packages 100a-100f are electrically coupled (e.g., soldered, sintered, etc.) to the printed circuit board 372. In another example, electronic device 370 may include a plurality of semiconductor packages 200 previously described and illustrated with reference to FIGS. 5A-5C in place of the plurality of semiconductor packages 100.

The first semiconductor package 100a includes a first die pad 102a, a first lead 104a, a plurality of second leads 106a adjacent to the first lead 104a, and a first mold material 110a. The first mold material 110a encapsulates at least a portion of the first die pad 102a, the first lead 104a, and the plurality of second leads 106a. A length of the first lead 104a extending from the first mold material 110a is less than a length of each of the plurality of second leads 106a extending from the first mold material 110a. In this example, the recess of the first die pad 102a may be excluded.

The second semiconductor package 100b includes a second die pad 102b, a third lead 104b, a plurality of fourth leads 106b adjacent to the third lead 104b, and a second mold material 110b. The second mold material 110b encapsulates at least a portion of the second die pad 102b, the third lead 104b, and the plurality of fourth leads 106b. A length of the third lead 104b extending from the second mold material 110b is less than a length of each of the plurality of fourth leads 106b extending from the second mold material 110b. In this example, the recess of the second die pad 102b may be excluded.

Likewise, each semiconductor package 100c-100f includes a die pad 102c-102f, a lead 104c-104f, a plurality of leads 106c-106f adjacent to the lead 104c-104f, and a mold material 110c-110f, respectively. The mold material 110c-110f encapsulates at least a portion of the die pad 102c-102f, the lead 104*c*-104*f*, and the plurality of leads 106*c*-106*f*, respectively. A length of the lead 104*c*-104*f* extending from the mold material 110*c*-110*f* is less than a length of each of the plurality of leads 106*c*-106*f* extending from the mold material 110*c*-110*f*, respectively. In this example, the recess of the each die pad 102*c*-102*f* may be excluded.

The printed circuit board 372 electrically couples the first lead 104*a* to the third lead 104*b* and to leads 104*c*-104*f* through a first trace 374. The printed circuit board 372 electrically couples each of the plurality of second leads 106*a* to each of the plurality of fourth leads 106*b* and to each of the plurality of leads 106*c*-106*f* through a second trace 376. The printed circuit board 372 electrically couples the first die pad 102*a* to the second die pad 102*b* and to die pads 102*c*-102*f* through a third trace 378. The trace layout of printed circuit board 370 is simplified due to leads 104*a*-104*f* extending a shorter distance from mold material 110*a*-110*f* than the plurality of leads 106*a*-106*f*, respectively.

Figure 11A:
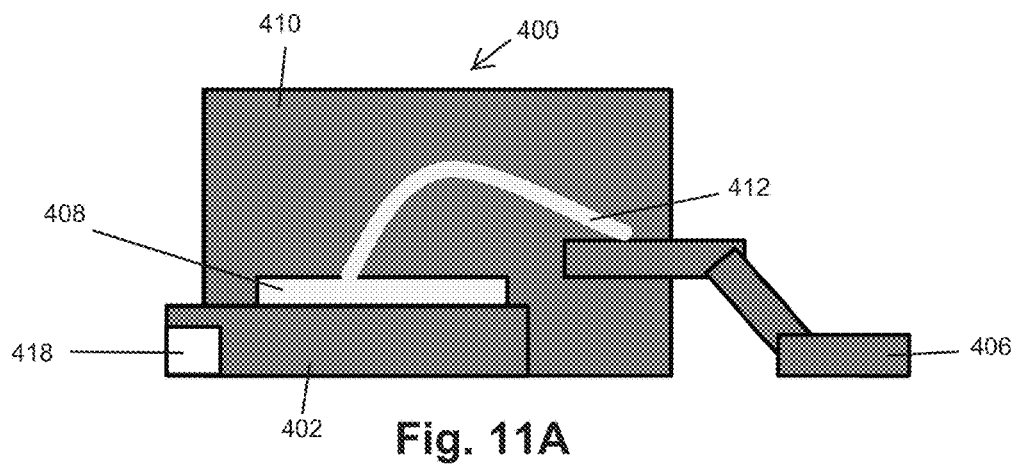
FIGS. 11A-11C illustrate a cross-sectional view, a top view, and a bottom view, respectively, of another example of a semiconductor package.
Figure 11B:
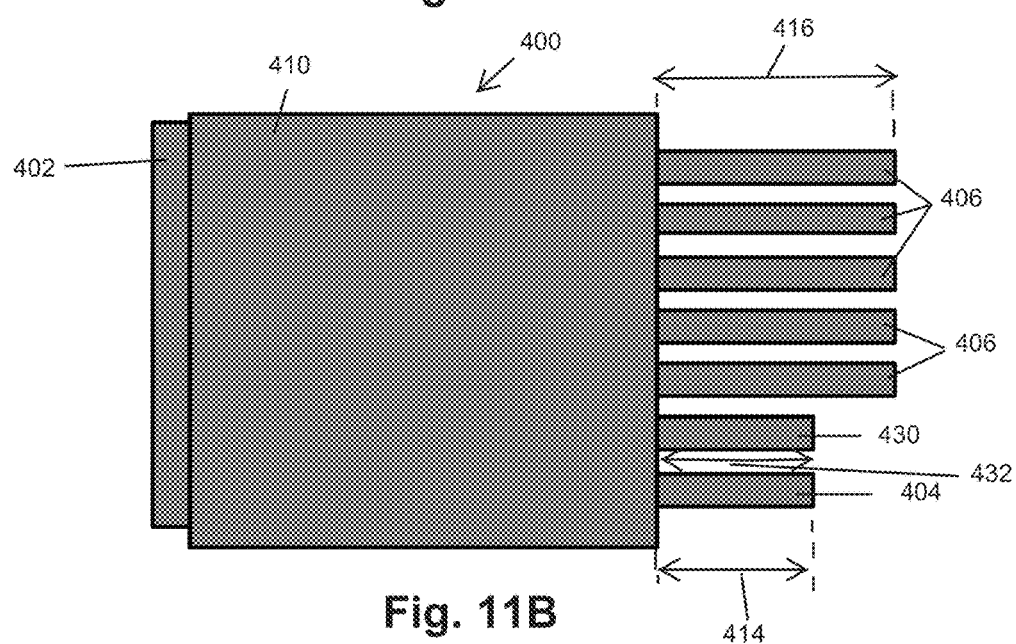
Figure 11C:
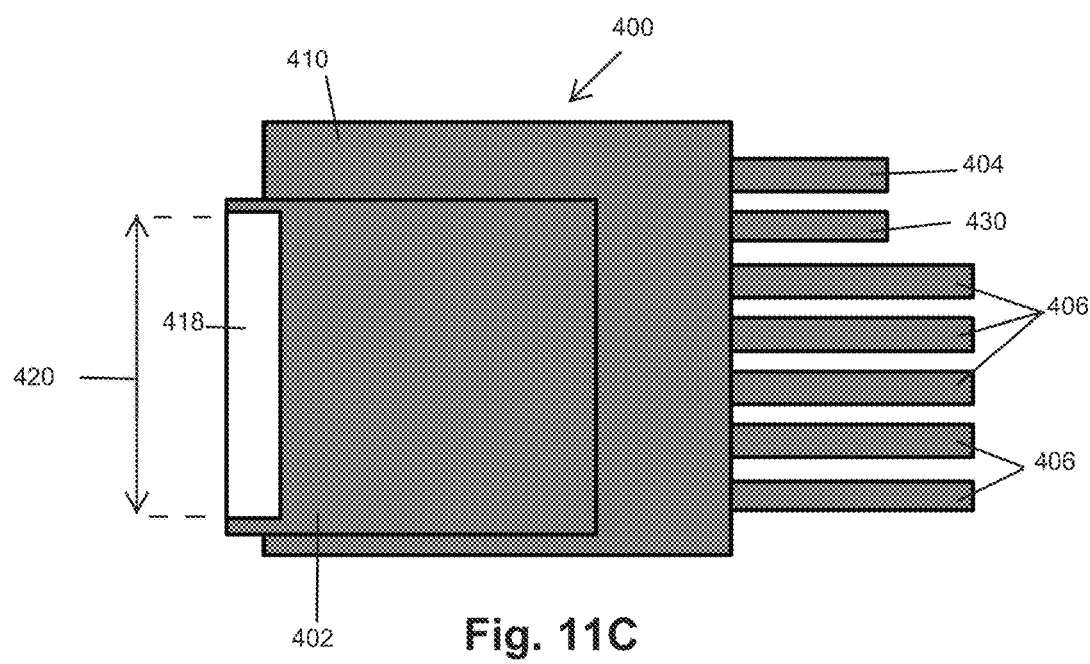

FIGS. 11A-11C illustrate a cross-sectional view, a top view, and a bottom view, respectively, of another example of a semiconductor package 400. Semiconductor package 400 may be a SMD package. Semiconductor package 400 includes a lead frame including a die pad 402, a first lead 404, a plurality of second leads 406, and a third lead 430. The lead frame may be made of a metal or have a metal surface, such as Ag, Cu, Ni/Pd/Au, NiNiP, or Ni/Pd/AuAg. As illustrated in FIG. 11A, the first lead 404, the plurality of second leads 406, and the third lead 430 may be gull-wing leads.

Semiconductor package 400 also includes a die 408 and mold material 410. The die 408 is electrically coupled (e.g., soldered, sintered, etc.) to the die pad 402. The first lead 404 is electrically coupled to the die 408 via a first bond wire (e.g., a bond wire 412). The plurality of second leads 406 are electrically coupled to the die 408 via a plurality of second bond wires (e.g., a plurality of bond wires 412) or a clip (not shown). The third lead 430 is electrically coupled to the die 408 via a third bond wire (e.g., a bond wire 412). The plurality of second leads 406 are adjacent to the first lead 404 and the third lead 430 on the same side of the semiconductor package 400. The mold material 410 encapsulates at least a portion of the die pad 402, the die 408, the first lead 404, the plurality of second leads 406, the third lead 430, and the bond wires 412 (or clip). Mold material 410 may include an epoxy or another suitable dielectric material.

Each of the plurality of second leads 406 extends a farther distance from the mold material 410 than the first lead 404 and the third lead 430. As indicated in FIG. 11B, the first lead 404 extends a first distance (or length) 414 from the sidewall of the mold material 410, each of the plurality of second leads 406 extends a second distance (or length) 416 from the sidewall of the mold material 410, and the third lead 430 extends a third distance (or length) 432 from the sidewall of the mold material 410. The second distance 416 is greater than the first distance 414 and the third distance 432. In this example, the third distance 432 equals the first distance 414. In other examples, however, the third distance 432 may be greater than the first distance 414 or less than the first distance 414. In one example, the first distance 414 and the third distance 432 are each within a range between about 20% and 80% of the second distance 416, such as between about 40% and 70% of the second distance 416. While in semiconductor package 400, the plurality of second leads 106 includes 5 second leads, in other examples the plurality of second leads may include a different number of second leads.

The die pad 402 may include a recess 418 along a bottom and side of the die pad. The recess 418 is configured to receive second leads of a further semiconductor package to electrically couple the die pad 402 to the second leads of the further semiconductor package. As indicated in FIG. 11C, the recess 418 may have a width 420 sufficient to receive each of the plurality of second leads of a further semiconductor package. The recess 418 is arranged on an opposite side of the die 402 from the first lead 404, the plurality of second leads 406, and the third lead 430.

In one example, die 408 includes a transistor, such as a power transistor. In one example, the die pad 402 is electrically coupled to a source of the transistor, the first lead 404 is electrically coupled to a gate of the transistor, the plurality of second leads 406 are electrically coupled to a drain of the transistor, and the third lead 430 is electrically coupled to a source sense or Kelvin sense of the transistor. In another example, the die pad 402 is electrically coupled to a drain of the transistor, the first lead 404 is electrically coupled to a gate of the transistor, the plurality of second leads 406 are electrically coupled to a source of the transistor, and the third lead 430 is electrically coupled to a source sensor of the transistor. In other examples, semiconductor package 200 previously described and illustrated with reference to FIGS. 5A-5C may include a flat third contact pad or lead having a similar function as third lead 430 of semiconductor package 400.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor package comprising:
   a die pad;
   a die electrically coupled to a first surface of the die pad;
   a first lead electrically coupled to the die;
   a plurality of second leads electrically coupled to the die, the plurality of second leads adjacent to the first lead; and
   a mold material encapsulating at least a portion of the die pad, the die, the first lead, and the plurality of second leads,
   wherein each of the plurality of second leads extends a farther distance from the mold material than the first lead, and
   wherein the die pad comprises a recess along a bottom and side of the die pad such that the first surface of the die pad extends over the recess; and
   wherein the recess is on an opposite side of the die from the first lead and the plurality of second leads.

2. The semiconductor package of claim 1, wherein the recess is configured to receive leads of a further semiconductor package to electrically couple the die pad to the leads of the further semiconductor package.

3. The semiconductor package of claim 1, wherein:
   the die comprises a transistor;
   the die pad is electrically coupled to a source of the transistor;
   the first lead is electrically coupled to a gate of the transistor; and
   the plurality of second leads are electrically coupled to a drain of the transistor.

4. The semiconductor package of claim 1, wherein:
the die comprises a transistor;
the die pad is electrically coupled to a drain of the transistor;
the first lead is electrically coupled to a gate of the transistor; and
the plurality of second leads are electrically coupled to a source of the transistor.

5. The semiconductor package of claim 1, further comprising:
a third lead electrically coupled to the die, wherein:
each of the plurality of second leads extends a farther distance from the mold material than the third lead;
the die comprises a transistor;
the die pad is electrically coupled to a drain of the transistor;
the first lead is electrically coupled to a gate of the transistor;
the plurality of second leads are electrically coupled to a source of the transistor; and
the third lead is electrically coupled to a source sensor of the transistor.

6. The semiconductor package of claim 1, wherein the semiconductor package comprises a surface mounted device (SMD) package.

7. The semiconductor package of claim 1, wherein the first lead is covered by the mold material.

8. The semiconductor package of claim 1, further comprising:
a first bond wire electrically coupling the first lead to the die; and
a plurality of second bond wires or a clip electrically coupling the plurality of second leads to the die.

9. The semiconductor package of claim 1, wherein the first lead and the plurality of second leads are flat and coplanar with the die pad.

10. The semiconductor package of claim 1, wherein the first lead and the plurality of second leads are gull-wing leads.

* * * * *